United States Patent [19]

Halim et al.

[11] Patent Number: 5,036,527
[45] Date of Patent: Jul. 30, 1991

[54] ITERATIVE AUTOMATIC GAIN CONTROL FOR AN ANALOG FRONT END OF A MODEM

[75] Inventors: Raouf Halim, Alpharetta; Daryush Shamlou, Duluth, both of Ga.

[73] Assignee: Hayes Microcomputer Products, Inc., Norcross, Ga.

[21] Appl. No.: 475,030

[22] Filed: Feb. 5, 1990

[51] Int. Cl.$^5$ .............................................. H03G 3/20
[52] U.S. Cl. ..................................... 375/98; 455/242; 455/245; 330/279
[58] Field of Search .................... 375/76, 98; 455/234, 455/239, 240, 242, 245, 246, 247, 250; 307/493; 328/173; 330/278, 279, 280

[56] References Cited

U.S. PATENT DOCUMENTS

| | | | |
|---|---|---|---|
| 4,204,172 | 5/1980 | Sadou et al. | 455/234 |
| 4,301,445 | 11/1981 | Robinson | 375/98 |
| 4,718,119 | 1/1988 | Salzer et al. | 455/245 |
| 4,794,620 | 12/1980 | Moore et al. | 375/98 |
| 4,829,593 | 5/1989 | Hara | 455/234 |

OTHER PUBLICATIONS

"An Analog Front End for High Speed Turnaround Modems", by R. Halim and D. Shamlou, IEEE CICC Conference Paper, May, 1989.

Primary Examiner—Benedict V. Safourek
Attorney, Agent, or Firm—Jones, Askew & Lunsford

[57] ABSTRACT

An apparatus and method is provided for detecting and amplifying the level of a received signal in the analog front end of a modem so as to maintain the level of the signal below a predetermined signal clipping level. An incoming signal is amplified by a predetermined amount of gain to provide a received signal. The level of the received signal is compared to a first reference level and a second reference level by a signal level detector. The comparative information regarding the level of the received signal is provided to a signal adjustment controller which provides control signals to the amplifier to maintain the received signal level between the first and second reference levels.

16 Claims, 3 Drawing Sheets

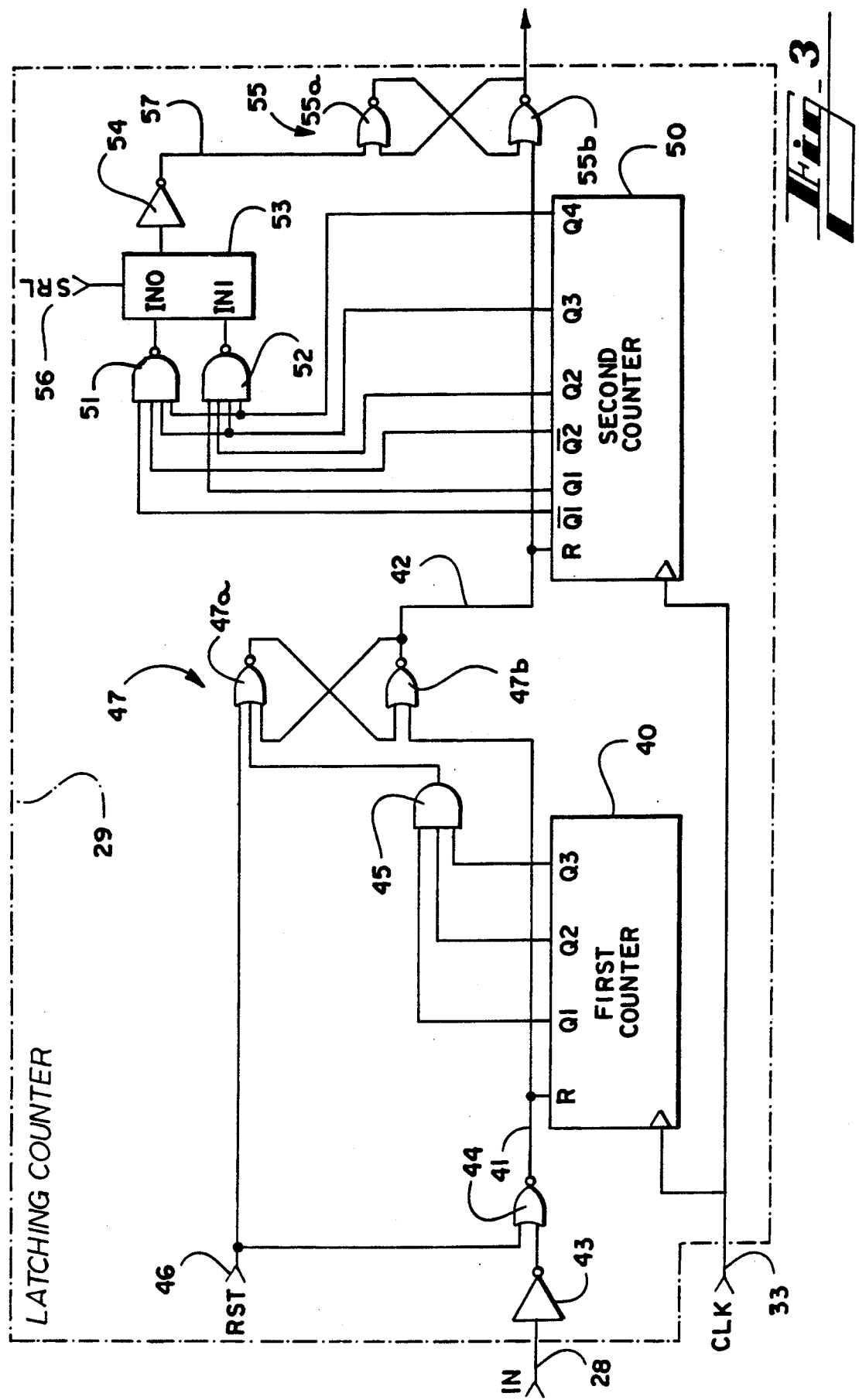

ITERATIVE AUTOMATIC GAIN CONTROL FOR AN ANALOG FRONT END OF A MODEM

TECHNICAL FIELD

The present invention relates to data communications devices, and more particularly relates to an apparatus and method for detecting and amplifying the level of a received signal in the analog front end of a modem so as to maintain the level of the incoming signal within a predetermined range of levels near a predetermined signal clipping level.

BACKGROUND OF THE INVENTION

Nearly instantaneous global communication is close to becoming a reality through recent technological advances in data communications equipment. Among the factors hindering the realization of this goal is a lack of worldwide standards for certain operating parameters of data communications equipment. One of these non-standard operating parameters is the range of levels of the received signals from public switched telephone networks and leased lines to which modems must respond. In the United States, modem receivers are normally designed to handle signals within the dynamic range of −48 dBm to −10 dBm. In contrast, modems used in various foreign countries are required to respond to received signal levels which vary over the broader range of −48 dBm to 0 dBm. Thus, data communication equipment used in global communications, including modem receivers, must possess a broader dynamic range than devices used only in the U.S.A. and be able to reliably receive and respond to signals within the −48 dBm to 0 dBm range.

It is well known that the received level signal for a modem communicating over the public switched telephone network will vary over a considerable range, even if the transmitted level at the transmitting modem remains constant. The level of the received signal is impacted by the condition of local lines, the routing of the call and a number of other variables which impacts signal level in the PSTN. Additionally, there is a dynamic component affecting the signal level including short term signal dropouts and the like which require dynamic amplification of the signal received from the line.

Modern modem designs are rapidly migrating toward high levels of system integration on integrated circuits, also referred to as chips. At the present time, a typical integrated circuit implementation of a modem includes an analog front end (AFE) chip, a digital signal processing (DSP) chip, and a microcontroller. Typically, the analog front end includes a port to receive an externally provided signal from the telephone line input to the modem in which the chip will be used. The first element is an anti-aliasing filter, followed by some form of automatic gain control. The present invention resides in an improvement to the automatic gain control circuit in such an analog front end. Following the automatic gain control, a switched capacitor filter is used, the output of which is provided to an analog-to-digital converter (ADC) circuit.

Due to the large number of switching transients encountered in the switched capacitor filter, the filter tends to be the noisiest element in the AFE chip. It establishes the base line signal to noise ratio which is acceptable in order to meet the minimum requirements for an acceptable signal to noise level at the output of the analog-to-digital converter.

For example, in a 9600 bps modem receiver, the minimum acceptable signal to noise ratio is approximately 30 dB to maintain a $10^{-5}$ bit error rate. The majority of noise in the analog front end of this modem receiver is generated by the switched capacitor band pass filter, which generates noise on the order of 500 microvolts or −63.80 dBm. Thus, the amplified incoming signal must be at least −33.8 dBm for acceptable performance, calculated as follows:

$$\text{Amplified incoming signal} - (-63.8 \text{ dBm}) \geq 30 \text{ dBm}$$

$$\text{Amplified incoming signal} \geq -33.8 \text{ dBm}$$

If the incoming signal is not at least at a level of −33.8 dBm, it must be amplified in order to maintain a minimum signal to noise ratio. As noted above, modem receivers used in the United States are designed to handle incoming signals with a dynamic range of −48 dBm to −10 dBm. Pursuant to the example above, if the incoming signal level was −48 dBm, only 14.2 dB of amplification would be required to boost the signal to −33.8 dBm. This would provide the acceptable minimum 30 dB signal to noise ratio. However, global communications require that modem receivers be equipped to handle incoming signals with a dyanmic range of −48 dBm to 0 dBm.

In prior art modem receivers, the level of the incoming signal is determined by a received level detector. This information is passed on to a controller and the level of the incoming signal is amplified as necessary to achieve an acceptable signal to noise ratio. In one example from the prior art, the present inventors designed a custom integrated circuit chip for the analog front end of a 9600 bps fast turnaround modem using CCITT Recommendation V.32 modulation. This prior art analog front end is more fully described by the present inventor, R. Halim and D. Shamlou, in the article entitled "An Analog Front End for High Speed Fast Turnaround Modems" which was presented at the IEEE CICC Conference in May 1989. In this prior art modem, the incoming signal level is detected by a received level detector in the AFE chip and the incoming signal is then amplified by one of the discrete gain levels of 0,6 or 12 dB as necessary to assure at least a minimum signal to noise ratio.

The received level detector comprises two parallel circuits, threshold detector-1 and threshold detector-2, each comprising an analog threshold comparator (ATC). In operation, each ATC compares the level of the incoming signal to a particular reference level. ATC-1 compares the incoming signal level to reference level-1 while ATC-2 compares the incoming signal level to reference level-2, which is 6 dB higher than reference level-1. After comparison, if the ATC determines that the incoming signal level has exceeded the assigned reference level, the ATC will output a logical 1 state. If the incoming signal level is determined to be below the reference level, the ATC will output a logical 0 state.

The output from the ATC is provided to a latching counter. The latching counter will latch to a logical 0 after a predetermined number of clock transitions with the signal from the ATC in a logical 0 state. The latching counter will latch to a logical 1 after a predetermined number of clock transitions with the signal from the ATC in a logical 1 state. The latched state of each threshold detector is then communicated to the controller which decides whether amplification of the incoming signal is necessary, and how much, if any, amplification is to be enabled according to the latched states as shown in Table 1 below.

TABLE 1

| TD-1 | TD-2 | Amplification |
|------|------|---------------|
| 0 | 0 | 12 dB |
| 0 | 1 | Invalid state |
| 1 | 0 | 6 dB |
| 1 | 1 | 0 dB |

From Table 1, an output of a logical 0 from both threshold detectors indicates that the incoming signal level is below both reference levels. Accordingly, the incoming signal is amplified by 12 dB. An output of a logical 0 from threshold detector-1 and a logical 1 from threlod detector-2 is an invalid state because the second reference level is higher than the first. It would not be possible for the incoming signal level to fall below the first reference level yet exceed the second reference level. An output of a logical 1 from threshold detector-1 and a logical 0 from threshold detector-2 indicates that the incoming signal level has exceeded the first reference level, but did not exceed the second reference level. In other words, this output indicates that the incoming signal level is between reference level 1 and reference level 2. Accordingly, the incoming signal is amplified by 6 dB. An output of a logical 1 from both threshold detectors indicates that the incoming signal level has exceeded both reference levels. Accordingly, the incoming signal is not amplified.

The maximum amount of amplification provided by this AFE chip is 12 dB. This poses a limitation on efforts to broaden the dynamic range of the prior art modem for global communications. Broadening the dynamic range as described above would require that the modem receiver amplify the incoming signal level by more than 12 dB. To accommodate a broader dynamic range in accordance with the detection system of this prior art AFE chip, a third parallel circuit would have to be added to the received level detector, i.e. a third threshold detector. This would include adding another analog threshold comparator with another reference level source. Thus, pursuant to the previous example, adding a third threshold detector to the received level detector would allow for amplification of the incoming signal by 0 dB, 6 dB, 12 dB or 18 dB.

From a circuit design point of view, it is apparent that expansion of the dynamic range of the AGC from 12 to 18 dB, while maintaining 6 dB steps, could be accomplished in a straightforward manner by adding a thrid threshold detector of the type described above. This represents a straightforward extension of the technique adopted in the above described AFE chip to expanding its dynamic range. However, this is an undesirable solution because of the relatively large chip area occupied by the threshold detector circuitry and the complications this would add to the layout of the chip. As is well known to those skilled in the art, moving to a larger die size significantly increases the expense of a given chip. Fabrication is more difficult and yield rates drop as the die size increases. Therefore, the present inventors were presented with a situation in which there was a strong need to modify the above described AFE chip in a manner which would allow expansion of the AGC gain range from 12 to 18 dB without unduly complicating the chip design or taking up more chip real estate. In other words, there was a need to expand the dynamic range without increasing the number of threshold level detectors, which increase yields an apparent solution.

However, it will be clear that the apparent solution violates the constraint that the chip design be minimally affected and that the real estate occupied by the received level detector not be significantly increased. Thus, a straightforward extension of the techniques used in the customized integrated circuit chip prior art presents an undesirable expansion of the chip area occupied by the AGC circuits in the AFE chip. The present invention is an improvement in the art of stepped received level detectors, or AGC circuits, used in integrated circuit analog front ends for a modem which provides the desired expansion of dynamic range described above, without increasing the number of threshold level detectors in the previous design.

SUMMARY OF THE INVENTION

The present invention provides an apparatus and method for detecting and amplifying the level of a received signal in the analog front end of a modem so as to maintain the level of the incoming signal within a predetermined range of levels near a predetermined signal clipping level.

Stated generally, the present invention provides an improved signal level detector, a signal adjustment controller and an amplifier in the analog front end of a modem. Generally speaking, the present invention includes a method and apparatus of providing any number of discrete gain steps in an integrated circuit implementation of an AGC circuit while using only 2 received level detectors. This is accomplished by proper selection of the levels detected and dynamically stepping the gain levels of the amplifying device by the discrete step size, followed by subsequent testing of the amplified signal level. Thus, the present invention accomplishes the expansion of the dynamic range of the AGC amplifier, using the same step size without increasing the number of threshold detector subassemblies required in the integrated circuit.

Both in the apparatus and method of the present invention, an incoming signal is amplified by one of a plurality of predetermined gain levels to provide a received signal. The level of the received signal is detected and information is provided to the signal adjustment controller as to whether the received signal level falls below or exceeds a first reference level, and whether the received signal level falls below or exceeds a second reference level. In response to this information, the signal adjustment controller provides control signals to the amplifier to maintain the received signal level between the reference levels.

In the preferred embodiment, the signal level detector of the present invention comprises a first threshold detector and a second threshold detector. The first threshold detector compares the level of the received signal to a first reference level and provides a first binary signal to the signal adjustment controller. The first signal provides a logical 1 output when the received signal is higher than the first reference level and a logical 0 when the received signal falls below the first reference level. Similarly, a second threshold detector provides a second binary signal which likewise assumes logical 1 and 0 states in response to the received signal being higher or lower, respectively, than the second reference level. Thus, the first and second threshold detectors provide respective first and second output signals which assume either first or second states for the output of the first detector, or second or third states for the output of the second detector.

In response to the state of the signals supplied by the frist and second threshold detectors, the signal adjustment controller provides a control signal to the amplifier to maintain the received signal level below the second reference level and above the first reference level. Whether amplification is necessary, and how much, if any, amplification is to be enabled, is determined in the preferred embodiment according to Table 2 below.

TABLE 2

| First Threshold Detector (First Signal) | Second Threshold Detector (Second Signal) | Received Signal Level | Amplification Step |
| --- | --- | --- | --- |
| 0 | 0 | Below first reference level | +6 dB |
| 0 | 1 | Invalid state | |
| 1 | 0 | Between first and second reference levels | 0 dB |
| 1 | 1 | Above second reference (clipping) level | −6 dB |

The control signal provided to the amplifier by the signal adjustment controller may have one of three control states. In response to the control signal being in the first control state, the amplifier changes to a next higher one of a plurality of predetermined discrete gain levels. In response to the control signal being in the second control state the amplifier remains at its then current discrete gain level. In response to the control signal being in the third control state, the amplifier changes to a next lower one of a plurality of predetermined discrete gain levels.

The present invention also provides a method for detecting and amplifying the level of a received signal in the analog front end of a modem so as to maintain the level of the signal within a predetermined signal clipping level. The method comprises the steps of amplifying the incoming signal by one of a plurality of predetermined discrete gain levels in response to a control signal to provide a received signal, and of detecting the level of the received signal. The method further comprises the steps of providing a first signal based on a comparison of the received signal level to a first reference level. The first signal is provided in one of two states, the first state or the second state. The first signal is provided in the first state if the received signal level is below the first reference level. Alternately, the first signal is provided in the second state if the received signal level exceeds the first reference level. The method further comprises the steps of providing a second signal based on a comparison of the received signal level to a second reference level. The second signal is also provided in one of two states, the third state or the fourth state. The second signal is provided in the third state if the received signal level is below the second reference level. Alternately, the second signal is provided in the fourth state if the received signal level exceeds the second reference level.

The method further comprises the steps of providing the control signal in response to the states of the first and second signals so as to maintain the received signal level between the first reference level and the second reference level. In the preferred embodiment, the control signal is provided in one of three states, the first control state, the second control state or the third control state.

Also in the preferred embodiment, the step of amplifying the incoming signal comprises changing the amplification of the incoming signal to a next higher one of a plurality of predetermined discrete gain levels in response to the control signal being in the first control state; leaving the amplification of the incoming signal at its then current gain level in response to the control signal being in the second control state; and changing the amplification of the incoming signal to a next lower one of the plurality of predetermined discrete gain levels in response to the control signal being in the third control state.

Although the preferred embodiment is directed toward use with a modem, it should be understood that the present invention may have application to other devices.

Therefore, it is an object of the present invention to provide an apparatus and a method which allow for the accommodation of a broad dynamic range of incoming signal levels without complicating the design or increasing the cost of an integrated circuit embodiment thereof.

It is a further object of the present invention to provide a device and a method for detecting and amplifying the level of an incoming signal in the analog front end of a modem so as to maintain the level of the incoming signal below a predetermined signal clipping level without expanding the integrated circuit chip area for the received level detectors of the AGC circuit.

It is still a further object of the present invention to provide an iterative constant step size AGC circuit, particularly suited for integrated circuit implementation, which, within practical limits of the dynamic response time, can provide any number of discrete gain levels while using only two threshold level detectors.

That the present invention and the preferred embodiment thereof overcome the drawbacks set forth above and accomplish the object of the invention set forth herein will become apparent from the detailed description of the preferred embodiment to follow.

BRIEF DESCRIPTION OF THE DRAWINGS

FIG. 3 is a schematic diagram of the latching counter of one of the signal threshold detectors of the preferred embodiment of the present invention.

DETAILED DESCRIPTION

Figure 1:
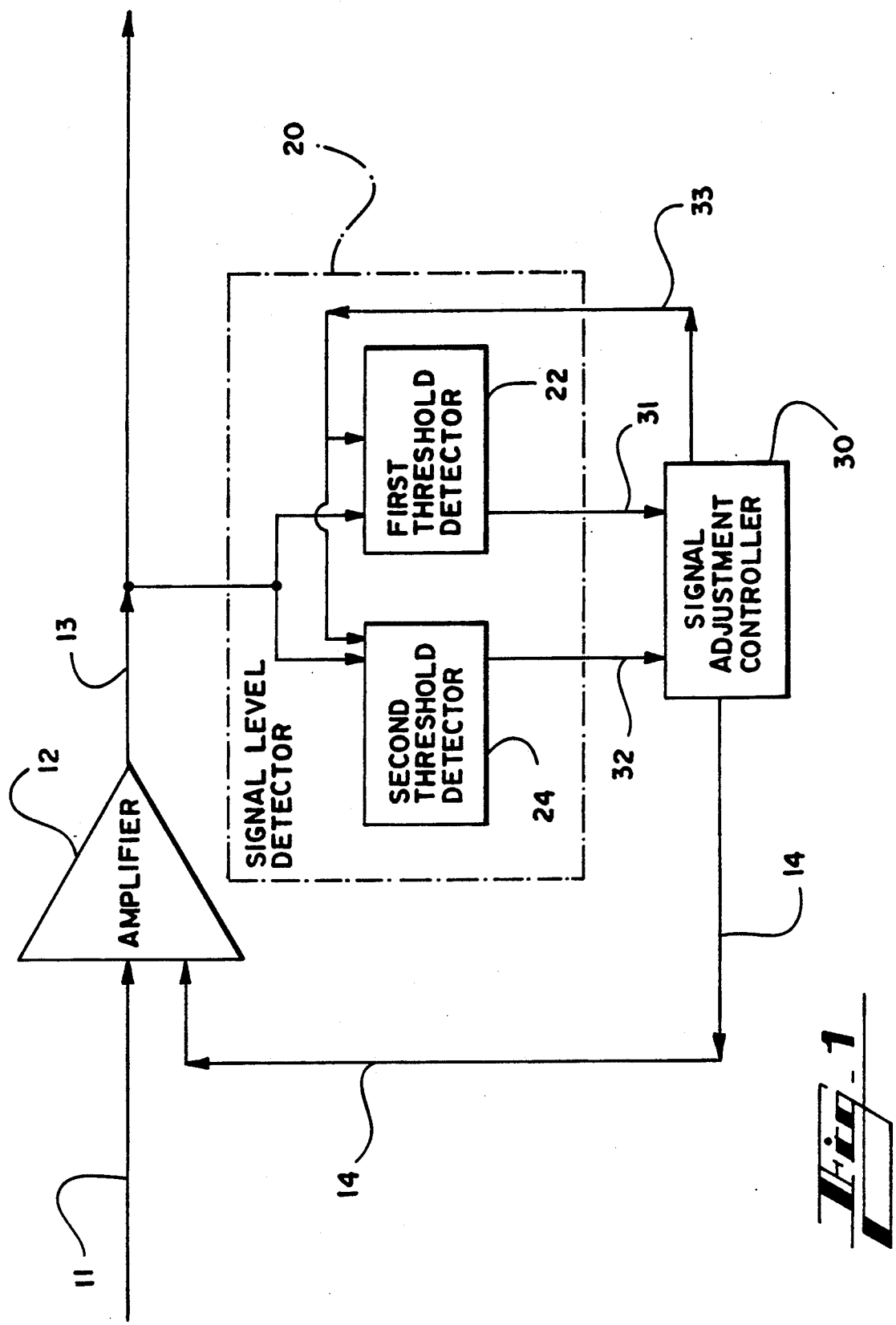
FIG. 1 is a block diagram of the preferred embodiment of the present invention.

Referring now to the drawings, in which like numerals indicate like elements throughout the several figures, FIG. 1 is a block diagram of the preferred embodiment of the present invention. Generally, the preferred embodiment of the present invention comprises an amplifier 12, a signal level detector 20 and a signal adjustment controller 30. The preferred environment of the present invention is in the analog front end of a modem, and in the preferred embodiment, components 12, 20 and 30 are implemented on an analog front end integrated circuit chip. An incoming signal received by the analog front end of the modem is filtered by an anti-aliasing filter (not shown) and then provided on signal path 11 to an amplifier 12. In the preferred embodiment, the amplifier 12 amplifies the incoming signal by discrete levels spaced 6 dB apart to provide a received signal on signal path 13. The amplification level of amplifier 12 is set in response to the control signal provided by the signal adjustment controller 30 on signal path 14.

The received signal on signal path 13 is provided to the first and second threshold detectors, 22 and 24 respectively, of the signal level detector 20. The first threshold detector 22 compares the level of the received signal to a first reference level and provides a binary signal on line 31 to the the signal adjustment controller 30 indicating whether the received signal level falls below or exceeds the first reference level. Operating in parallel with the first threshold detector 22, the second threshold detector 24 compares the level of the received signal to a second reference level and provides a binary signal on line 32 to the signal adjustment controller 30 indicating whether the received signal level falls below or exceeds the second reference level. The signal adjustment controller 30 provides a clock signal on signal line 33 to the first and second threshold detectors, 22 and 24 which is used by the counters shown in FIGS. 2 and 3. In response to the information provided by the first and second threshold detectors, 22 and 24, the signal adjustment contoller 30 provides a control signal on signal path 14 to the amplifier 12 so as to maintain the received signal level between the first and second reference levels.

Figure 2:
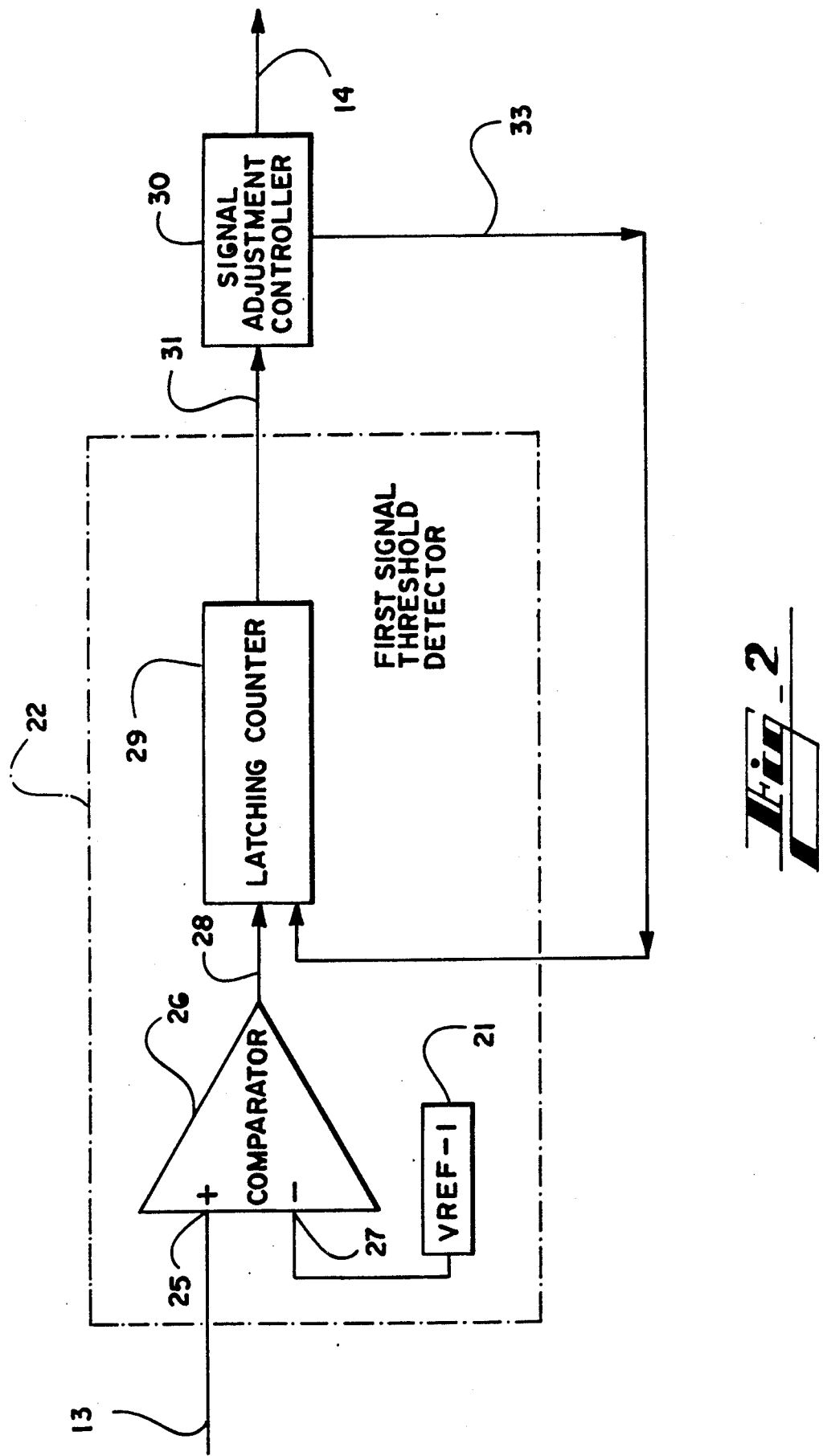
FIG. 2 is a block diagram of one of the signal threshold detectors of the preferred embodiment of the present invention.

FIG. 2 is a block diagram of the detail of the first threshold detector 22 of the preferred embodiment of the present invention. As explained in connection with FIG. 1, the received signal is provided on signal path 13 to the first and second threshold detectors, 22 and 24, of the signal level detector 20. With particular respect to the first threshold detector 22, the received signal is provided first to the positive input terminal 25 of a comparator 26. Comparator 26 compares the received signal level to a first reference level to determine whether the received signal level falls below or exceeds the first reference level. In the preferred embodiment, the first reference level is a predetermined reference voltage provided by a reference voltage source 21 to the inverting input 27 of comparator 26. In the preferred embodiment the first reference voltage is 1.36 volts.

Comparator 26 provides a binary comparator output signal on line 28 to the latching counter 29. In the preferred embodiment, if the received signal level is below the first reference level, the comparator 26 will output a logical 0. If the received signal level is above the first reference level, the comparator 26 will output a logical 1 on line 28.

The binary comparator output signal from the comparator 26 is clocked into the latching counter 29 in response to the clock signal provided on line 33 by the signal adjustment controller 30. The comparator outputs on line 28 are clocked into latching counter 29 on the rising edge of the clock signal on line 33. Latching counter 29 provides both damping and hysteresis to the comparator output signal on line 28 in the following manner. If counter 29 clocks in seven sequential zeros from line 28, its output on line 31 is forced to a logical 0 state. If a predetermined number of logic 1's on line 28 are clocked into counter 29, the output on line 31 switches to a logical 1 state. In the absence of either of theses conditions, the output on line 31 remains unchanged.

In the preferred embodiment the predetermined number of logic 1's which will force the output of counter 29 to a logic 1 is either 12 or 15, depending on the operating state of the modem. A signal line from the modem's microcontroller (not shown in FIG. 2) indicates whether the modem is executing a handshaking sequence or an on-line data communications mode. In the preferred embodiment, 12 sequential logic 1's clocked into counter 29 forces its output to logic 1 during the handshaking sequence while 15 sequential logic 1's are required in the on-line mode.

Those skilled in the art will recognize that this arrangement provides a variable release time for the AGC as a function of whether the modem is handshaking or providing normal on-line communications. The greater number of sequential logic 1's required to force the counter's output to logic 1 means that the modem is slower responding to a condition in which the received signal exceeds the reference, thus having a slower release time for the AGC constructed using the detector of FIG. 2.

Thus, it will be appreciated that threshold detector 22 comprises a latching counter 29 which provides a first output state in response to receipt of a first predetermined number of sequential samples of a first state in the output of comparator 26 and provides a second output state in response to receipt of a second predetermined sequential samples of the opposite state from the comparator 26.

In the preferred embodiment, the second threshold detector 24 operates in parallel and in the same manner as the first threshold detector 22 except that the second reference level differs from the first reference level. In the preferred embodiment, the second reference level is provided by a second voltage reference and is set at 3.5 volts. This constitutes the predetermined signal clipping level for the AFE output and analog to digital converter. Returning to FIG. 1, it will be appreciated that in the preferred embodiment the second threshold detector 24 provides a signal on signal path 32 to the signal adjustment controller 30 to indicate whether the received signal exceeds the clipping level. In the preferred embodiment, if the received signal level is below the second reference level, the second threshold detector 24 will output logical 0 on line 31. If the received signal level exceeds the second reference level, it will output a logical 1. Thus, if the received signal level exceeds the second reference level, it is an indication that the incoming signal is being clipped with the consequent loss of information.

As noted in connection with FIG. 1, a control signal is provided by the signal adjustment controller 30 to the amplifier 12 to amplify an incoming signal by one of a plurality of discrete gain levels. The signal adjustment controller 30 provides a control signal to the amplifier 12 in response to the state of the signals provided by the first and second threshold detectors, 22 and 24. In the preferred embodiment, the control signal may have one of three states. The control signal on signal path 14 may be determined by Table 2, set forth in the foregoing summary of the invention. The preferred embodiment operates in accordance with Table 2 as follows. Whenever the first threshold detector outputs a logical 0, the control signal on signal path 14 causes amplifier 12 to increase its amplification level by 6 dB. From inspection of FIG. 1 in the foregoing description it will be appreciated that this is an indication that the received signal level falls below both reference voltages.

When the signal level exceeds the first reference level the first threshold detector outputs a logical 1. Under these conditions, the control signal on signal path 14 is determined by the output of the second threshold detector. A logical 0 output from second threshold detector 24 shows that the signal is below the clipping level but still above the first level by virture of the logical 1 output from the first threshold detector 22. Therefore, the amplification level is appropriate and the control signal on signal path 14 instructs amplifier 12 to leave its amplification level unchanged. When the output of both threshold detectors is logic 1, the input signal exceeds the clipping level and the control signal instructs amplifier 12 to decrease its amplification level by one 6 dB step.

FIG. 3 is a schematic diagram of the latching counter 29 of one of the threshold detectors, 22 and 24, of the preferred embodiment of the present invention. As noted above in connection with FIG. 2, the binary comparator output signal from the comparator 26 is provided as input to the latching counter 29 via signal path 28. In the preferred embodiment, latching counter 29 comprises a first counter 40 with a first NOR gate latch 47 and a second counter 50 with a second NOR gate latch 55. Clock inputs from the signal adjustment controller 30 are provided to both the first and second counters, 40 and 50, on line 33. In the preferred embodiment, this signal has a frequency of clock 150 Hz. Counters 40 and 50, their respective associated NOR gate latches 47 and 55, and the decoding logic associated therewith are used to integrate the samples of comparator output on line 28. The integration is accomplished by requiring predetermined numbers of sequential logic 1 or logic 0 samples on line 28 before the respective counters 50 or 40 will provide decoded outputs causing latching counter 29 to change output states.

Operation of latching counter 29 is straightforward and will be explained herein. Assume for the moment that reset input 46 is held low. Further assume that a logical 1 is present on line 28. Under these circumstances, the action of inverter 43 and NOR gate 44 will cause the logical 1 to appear on line 41 resetting counter 40. The logical 1 on line 41 also forces the output of latch 47, which appears on line 42, to a logical 0 state. This leaves NOR gate 55b under the control of the output of NOR gate 55a and thus latch 55 will remain in its present state unless forced to change state by NOR gate 55a.

So long as the logical 1 is present on line 28, counter 40 will be cleared on each rising edge of the clock signal on line 33 and thus will remain cleared. In its cleared condition, all of its outputs are zero and thus decoding AND gate 45 outputs a logical 0. From this it will be appreciated that all inputs to NOR gate 47a are logical 0 causes its output to be a logical 1 which leaves latch 47 in its zero state.

In this condition, logical 0 on line 42 keeps the reset input to counter 50 inactive, and counter 50 will continue to count until one of its predetermined counts is decoded by one of AND gates 51 or 52. Thus, when a logical 1 is present in the input of line 28, second counter 50 is active to count a number of sequential cycles of the clock signal on line 33 for which the input on line 28 is a logical 1.

Conversely, whenever the input on line 28 is a logical 0, line 41 is forced to its 0 state. When a one to zero transition takes place on line 41, NOR gate latch 47 will remain in its same latched output state, putting a 0 on line 42, until one of the inputs to NOR gate 47a goes high. Logical 0 on line 41 removes the reset signal from counter 40 and the counter begins counting. If seven sequential cycles of the clock signal on line 33 occur without line 41 returning to its logical 1 state, the counter will count to seven and this state will be decoded by AND gate 45 which will force one input to NOR gate 47a high. This forces the output of NOR gate 47a low causing latch 47 to change state outputting a logical 1 on line 42. The logical 1 on line 42 forces output line 31 of counter 29 low through the action of NOR gate 55b. Thus it will be appreciated that whenever first counter 40 is allowed to count to its seven state, the output of counter 29 is forced low. Thus counter 40 will count seven sequential clock periods for which the input on line 28 is zero and thereby force the output of latching counter 29 low whenever this condition occurs.

Returning for a moment to the counting of ones by counter 50 it will be appreciated by observation that multiplexer 53 selects one of the two NAND gate decoders 51 or 52 which controls the state of line 57. Line 56 carries a slow received level (SRL) signal which is output from the modem's microcontroller (not shown) when the modem is in an online data communications mode. An active signal on line 56 selects input one of multiplexer 53 thus connecting the output of NAND gate 52 to inverter 54. As may be seen from inspection of FIG. 3, NAND gate 52 detects a count of 15 for second counter 50. When the modem is in the handshaking mode, a faster release time for the AGC is desired and a logical 0 on line 56 selects the output and NAND gate 51. NAND gate 51 decodes a count of 12 from counter 50, and may be ascertained by inspection of the drawing.

From the foregoing description those skilled in the art will appreciate several following operational aspects of latching counter 29 and the received level detector and AGC of the preferred embodiment. First, latching counter 29 has the output of latch 55 as its output. Whenever output 50 counts to its detected output count of either 12 or 15 (depending on the state of SRL signal 56) the output on line 31 is forced high. Whenever counter 40 reaches a count of seven, line 42 will be forced high forcing the output on line 31 low. For transitions of the signal level on line 28 which are timed so as not to allow either counters 40 or 50 to reach one of their decoded count states, the output on line 31 will remain latched in its then present state since it is only one of the decoded count states, or a logical 1 on reset input 46, which will force latch 55 into a particular output state. Thus, the requirements established by latching counter 29 for a sequential number of clock cycles to occur with the input on line 28 in either its one or zero condition before the output of the counter will be forced to change states provides an integration function for the received level detectors. Additionally, the selection of different decoded counts for the one to zero and zero to one transitions of the output on line 31 provides hysteresis to the latching counters.

Next, the overall operation of the step AGC of the preferred embodiment should be considered. As noted hereinabove, the frequency of this clock signal on line 33 is 150 Hz. This gives it a period of 6.67 milliseconds. Consider for a moment the condition in which the input signal on line 11 undergoes a sudden precipitous drop in signal level such that the net result is that amplifier 12 needs to go from a state in which it is providing 0 dB of amplification to one which requires 18 dB of amplification. Under these circumstances counter 29 would begin counting sequential zeroes. It takes seven clock periods, or approximately 46.6 milliseconds for the seven consecutive zeroes to be counted. The first time this occurs, the signal adjustment controller 30 (FIG. 1) will cause the control signal in path 14 to step up the gain of amplifier 12 by 6 dB. Since under the described circumstances this is still inadequate, and additional 46.6 milliseconds is required for the next step, and yet another period of this magnitude for the third step to be achieved. Therefore, under the worst case condition, the attack time of the AGC is approximately 140 milliseconds.

If the signal subsequently rises very rapidly, a similar analysis for the release time indicates that three sequential periods of 15 periods of the clock signal on line 33 must occur for the AGC to completely release returning amplifier 12 to its 0 dB amplification state. This leads to a release time on the order of 300 milliseconds.

Therefore, the present invention represents something of the tradeoff between speed of attack and release times of the AGC and use of integrated circuit chip real estate for providing discrete level detectors.

From the foregoing it will be further appreciated that other embodiments of the present may be constructed employing smaller discrete amplification levels for amplifier 12 at the cost of slower attack and release times. This can be offset to some degree by selection of smaller integration periods for the state transitions of the latching counters which in turn is accomplished by decoding lower counts of the first and second counters 40 and 50 of latching counter 29.

In view of the foregoing description of the preferred embodiment it will be appreciated that the present invention overcomes the drawbacks of the obvious solution of the problem presented to the present inventors and meets the objects of the invention described hereinabove. In view of the foregoing description other embodiments of the present invention will suggest themselves to those skilled in the art and therefore the scope of the present invention can be limited only by the claims below.

We claim:

1. An apparatus for maintaining the level of a received signal in the analog front end of a modem between a first reference level and a second reference level, comprising:
   amplification means for amplifying an incoming signal by one of a plurality of predetermined discrete gain level in response to a control signal to provide said received signal;
   first detection means for providing a first signal having a first state in response to said received signal level being below said first reference level and alternately having a second state in response to said received signal level exceeding said first reference level, comprising a comparator for comparing said received signal level to said first reference level and for providing a binary comparator output signal in response thereto at a comparator output, means for clocking said binary comparator output signal into a counter in response to a clock signal, said counter providing said first state in response to each occurrence of said counter counting a first predetermined number of sequential occurrences of a zero state of said binary comparator output signal and providing said second state in response to each occurrence of said counter counting a second predetermined number of sequential occurrences of a one state of said binary comparator output signal;
   second detection means for providing a second signal having a third state in response to said received signal level being below said second reference level and alternately having a fourth state in response to said received signal level exceeding said second reference level; and
   signal adjustment means for providing said clock signal and for providing said control signal in response to said first and second signals to maintain said received signal level below said second reference level.

2. The apparatus of claim 1, wherein
   said control signal has at least three distinct first, second and third control states and said signal adjustment means causes said control signal to be in said first control state in response to said first signal having said first state; and
   said amplification means changes to a next higher one of said plurality of predetermined discrete gain levels in response to said control signal being in said first control state.

3. The apparatus of claim 1, wherein
   said control signal has at least three distinct first, second and third control states and said signal adjustment means causes said control signal to be in said second control state in response to said first signal having said second state and said second signal having said third state; and
   said amplification means remains at its then current one of said plurality of predetermined discrete gain levels in response to said control signal being in said second control state.

4. The apparatus of claim 1, wherein
   said control signal has at least three distinct first, second and third control states and said signal adjustment means causes said control signal to be in said third control state in response to said second signal having said fourth state; and
   said amplification means changes to a next lower one of said plurality of predetermined discrete gain levels in response to said control signal being in said third control state 5. An apparatus for maintaining the level of a received signal in the analog front end of a modem between a first reference level and a second reference level, comprising:
   amplification means for amplifying an incoming signal by one of a plurality of predetermined discrete gain levels in response to a control signal to provide said received signal;
   first detection means for providing a first signal having a first state in response to said received signal level being below a first reference level and alternately having a second state in response to said received signal level exceeding said first reference level;

second detection means for providing a second signal having a third state in response to said received signal level being below a second reference level and alternately having a fourth state in response to said received signal level exceedig said second reference level, comprising a comparator for comparing said received signal level to said second reference level and for providing a binary comparator output signal in response thereto at a comparator output, means for clocking said binary comparator output signal into a counter in response to a clock signal, said counter providing said third state in response to each occurrence of said counter counting a third predetermined number of sequential occurrences of a zero state of said binary comparator output signal and providing said fourth state in response to each occurrence of said counter counting a fourth predetermined number of sequential occurrences of a one state of said binary comparator output signal; and signal adjustment means for providing said clock signal for providing said control signal in response to said first and second signals to maintain said received signal level below said reference level.

6. The apparatus of claim 5, wherein
said conrol signal has at least three distinct first, second and third control states and said signal adjustment means causes said control signal to be in said first control state in response to said first signal having said first state; and
said amplificaion means changes to a next higher one of said plurality of predetermined discrete gain levels in response to said control signal being in said first control state.

7. The apparatus of claim 5, wherein
said control signal has at least three distinct first, second and third control states and said signal adjustment means causes said control signal to be in said second control state in response to said first signal having said second state and said second signal having said third state; and
said amplification means remains at its then current one of said plurality of predetermined discrete gain levels in response to said control signal being in said second control state.

8. The apparatus of claim 5, wherein
said control signal has at least three distinct first, second and third control states and said signal adjustment means causes said control signal to be in said third control state in response to said second signal having said fourth state; and
said amplification means changes to a next lower one of said plurality of predetermined discrete gain levels in response to said control signal being in said third control state.

9. A method for maintaining the level of a received signal in the analog front end of a modem between a first reference level and second reference level, comprising the steps of;
amplifying an incoming signal by one of a plurality of predetermined discrete gain levels in response to a control signal to provide said received signal;
detecting the level of said received signal;
providing a first signal having a first state in response to said received signal level being below a first reference level and alternately having a second state in response to said received signal level exceeding said first reference level, wherein said step of providing said first signal comprises providing a clock signal, comparing said received signal level to said first reference level and providing a binary comparator output signal in response thereto, clocking said binary comparator output signal into a counter in response to said clock signal, providing said first state in response to each occurrence of said counter counting a first predetermined number of sequential occurrences of a zero state of said binary comparator output signal, and providing said second state in response to each occurrence of said counter counting a second predetermined number of sequential occurrences of a one state of said binary comparator output signal;

providing a second signal having a third state in response to said received signal level below a second reference level and alternately having a fourth state in response to said received signal level exceeding said second reference level; and providing said control signal in response to said first and second signals to maintain said received signal level below said second reference level.

10. The method of claim 9, wherein
said control signal has at least three distinct first, second and third control states;
wherein said step of providing said control signal comprises providing said first control state of said control signal in response to said first signal having said first state; and
wherein said step of amplifying said incoming signal comprises changing said amplification of said incoming signal to a next higher one of said plurality of predetermined discrete gain levels in response to said control signal being in said first control state.

11. The method of claim 9, wherein
said control signal has at least three distinct first, second and third control states;
wherein said step of providing said control signal comprises providing said second control state of said control signal in response to said first signal having said second state and said second signal having said third state; and
wherein said step of amplifying said incoming signal comprises leaving said amplification of said incoming signal at its then current one of said plurality of predetermined discrete gain levels in response to said control signal being in said second control state.

12. The method of claim 9, wherein
said control signal has at least three distinct first, second and third control states;
wherein said step of providing said control signal comprises providing said third control state of said control signal in response to said second signal having said fourth state; and
wherein said step of amplifying said incoming signal comprises changing said amplification of said incoming signal to a next lower one of said plurality of predetermined discrete gain levels in response to said control signal being in said third control state.

13. A method for maintaining the level of a received signal in the analog front end of a modem between a first reference level and a second reference level, comprising the step of:
amplifying an incoming signal by one of a plurality of predetermined discrete gain levels in response to a control signal to provide said received signal;
detecting the level of said received signal;

providing a first signal having a first state in response to said received signal level being below a first reference level and alternately having a second state in response to said received signal level exceeding said first reference level;

providing a second signal having a third state in response to said received signal level being below a second reference level and alternately having a fourth state in response to said received signal level exceeding said second reference level, wherein said step of providing a second signal comprises providing a clock signal, comprising said received signal level to said second reference level and providing a binary comparator output signal in response thereto, clocking said binary comparator output signal into a counter in response to said clock signal, providing said third state in response to each occurrence of said counter counting a third predetermined number of sequential occurrences of a zero state of said binary comparator output signal, and providing said fourth state in response to each occurrence of said counter counting a fourth predetermined number of sequential occurrences of a one state of said binary comparator output signal; and providing said control signal in response to said first and second signals to maintain said received signal below said second reference level.

14. The method of claim 13, wherein
said control signal has at least three distinct first, second and third control states;

wherein said step of providing said control signal comprises providing said first control state of said control signal in response to said first signal having said first state; and wherein the step of amplifying said incoming signal comprises changing said amplification of said incoming signal to a next higher one of said plurality of predetermined discrete gain levels in response to said control signal being in said first control state.

15. The method of claim 13, wherein
said control signal has at least three distinct first, second and third control states;

wherein said step of providing said control signal comprises providing said second control state of said control signal in response to said first signal having said second state and said second signal having said third state; and wherein said step of amplifying said incoming signal comprises leaving said amplification of said incoming signal at its then current one of said plurality of predetermined discrete gain levels in response to said control signal being in said second control state.

16. The method of claim 13, wherein
said control signal has at least three distinct first, second and third control states;

wherein said step of providing said control signal comprises providing said third control state of said control signal in response to said second signal having said fourth state; and wherein said step of amplifying said incoming signal comprises changing said amplification of said incoming signal to a next lower one of said plurality of predetermined discrete gain levels in response to said control signal being in said third control state.

* * * * *